United States Patent
Stansell et al.

(10) Patent No.: US 7,426,142 B1
(45) Date of Patent: Sep. 16, 2008

(54) DEVICE AND METHOD FOR SENSING PROGRAMMING STATUS OF NON-VOLATILE MEMORY ELEMENTS

(75) Inventors: Galen E. Stansell, Kirkland, WA (US); Tomasz Cewe, Bothell, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 118 days.

(21) Appl. No.: 11/415,694

(22) Filed: May 1, 2006

Related U.S. Application Data

(60) Provisional application No. 60/678,301, filed on May 5, 2005.

(51) Int. Cl.
*G11C 16/06* (2006.01)

(52) U.S. Cl. ............. 365/185.21; 365/201; 365/189.07; 365/225.7

(58) Field of Classification Search ............ 365/185.21, 365/201, 189.07, 225.7, 210, 189.05
See application file for complete search history.

(56) References Cited

U.S. PATENT DOCUMENTS

| | | | |
|---|---|---|---|
| 5,315,177 A | 5/1994 | Zagar et al. | |
| 5,734,617 A | 3/1998 | Zheng | |
| 5,812,477 A | 9/1998 | Casper et al. | |
| 5,875,144 A | 2/1999 | Zheng | |
| 5,978,298 A | 11/1999 | Zheng | |
| 5,986,932 A | 11/1999 | Ratnakumar et al. | |
| 6,011,742 A | 1/2000 | Zheng | |
| 6,016,264 A | 1/2000 | Lin | |
| 6,084,814 A | 7/2000 | Casper et al. | |
| 6,097,618 A | 8/2000 | Jenne | |
| 6,122,191 A | 9/2000 | Hirose et al. | |
| 6,172,907 B1 | 1/2001 | Jenne | |
| 6,181,627 B1 | 1/2001 | Casper et al. | |
| 6,363,011 B1 | 3/2002 | Hirose et al. | |
| 6,420,925 B1 | 7/2002 | Fifield et al. | |
| 6,469,930 B1 | 10/2002 | Murray | |
| 6,490,203 B1 * | 12/2002 | Tang .................... | 365/185.22 |
| 6,553,556 B1 | 4/2003 | Blodgett | |
| 6,556,487 B1 | 4/2003 | Ratnakumar et al. | |
| 6,574,145 B2 * | 6/2003 | Kleveland et al. ...... | 365/185.19 |
| 6,621,324 B2 | 9/2003 | Fifield et al. | |
| 6,625,080 B2 | 9/2003 | Casper et al. | |
| 6,633,506 B2 | 10/2003 | Casper et al. | |
| 6,741,117 B2 | 5/2004 | Lee | |
| 6,759,895 B2 * | 7/2004 | Takami .................... | 365/225.7 |
| 7,146,585 B2 | 12/2006 | Blodgett | |
| 7,149,114 B2 | 12/2006 | Taheri et al. | |

* cited by examiner

*Primary Examiner*—David Lam
(74) *Attorney, Agent, or Firm*—Haverstock & Owens, LLP

(57) ABSTRACT

A test circuit can test a status of a group of non-volatile elements. A current flowing to the group of non-volatile elements can be compared against a reference value. If the current is determined to be outside of a predetermined range, the non-volatile elements can be determined to be programmed. In particular embodiments, non-volatile elements can be sections of differential one-time programmable anti-fuse latch memory elements.

20 Claims, 7 Drawing Sheets

DEVICE AND METHOD FOR SENSING PROGRAMMING STATUS OF NON-VOLATILE MEMORY ELEMENTS

This application claims the benefit of U.S. provisional patent application Ser. No. 60/678,301, filed May 5, 2005, the contents of which are incorporated by reference herein.

TECHNICAL FIELD

The present invention relates generally to electronic circuits and in particular to circuits that include non-volatile memory elements that can have a programmed or unprogrammed state.

BACKGROUND OF THE INVENTION

Non-volatile (NV) memories can be widely used in many electronics applications to store data when power is not present. Examples of non-volatile memories include electrically programmable read only memories (EPROMs), such as ultraviolet (UV) erasable EPROMS, as well as electrically erasable non-volatile technologies including electrically erasable and programmable ROMs (EEPROMs), including "flash" EEPROMs, as well as magneto-resistive random access memories (MRAMs). These types of memories can be erased or written to a default state prior to being programmed for a given application. In some applications, technologies like those listed above may not be commercially viable, because they can be relatively expensive.

A different technology type that can be more cost effective than those listed above is anti-fuse technology. Anti-fuse technology can include an unprogrammed state the presents a very high impedance, and can be programmed to a lower impedance state. Thus, in a programmed state an anti-fuse device can draw some current, while in an unprogrammed state it can draw essentially no current. While very cost effective, anti-fuse devices can present great variability in resistance in the programmed state, presenting resistances that can vary by more than six orders of magnitude during normal operation. Alternatively, other arrangements can include fuses. Fuses include an unprogrammed state the presents a relatively low impedance, and can be programmed to a very high impedance state. Thus, in an unprogrammed state anti-fuse device can draw some current, while in a programmed state it can draw essentially no current. Anti-fuse and fuse technologies can be considered one-time programmable (OTP), as once they are programmed they may not be unprogrammed.

OTP technology can have various configurations, including "single-ended" OTP NV memory. Such a memory can include memory elements that can have a default state that is only selectively over-written. Another kind of non-volatile memory is a differential OTP NV memory. In a differential OTP memory element, two anti-fuse structures can have opposite states (one programmed, the other unprogrammed) to force a latch to a particular state. Single-ended OTP memory cells may not be as robust as differential OTP memory cells.

It can be desirable to test a NV memory device to determine if it is programmed. FIG. 11 shows a conventional circuit for testing a programming status of NV elements within memory device. Conventional circuit 1100 can include a validation key section 1102, an NV section 1104, a binary comparator circuit 1106, and control logic 1108. A validation key section 1102 can include circuits that provide a predetermined binary value KEY. Such a value KEY can be manufactured into a device, and thus be generated from a ROM circuit having values set by a manufacturing mask, or by laser programmed fuses, etc. A NV section 1104 can include a number of NV memory cells. Prior to being programmed, NV section 1104 can be expected to generate essentially random values. In contrast, when the memory device is programmed, memory cells within NV section 1104 can be programmed to store the value KEY.

In a test operation, a value provided by NV section 1104 can be compared to validation key KEY within comparator circuit 1106. If such values do not match, signal PRGD output from comparator circuit 1106 can be inactive, and the memory device can be determined to be not programmed. However, if such values do match, signal PRGD can be active, and the memory device can be determined to be programmed.

A second kind of conventional testing approach can be to manufacture a memory device having memory cells with NV element operating in conjunction with "weighted" latches. Weighted latches can be biased to latch to one logic value over the other. In such memory cells, absent a distinct programmed state, the memory cells will store a predetermined default logic value, determined by the latch weighting. In a test mode, memory cell values can be read, and if all are in the default state, the device can be determined to be non-programmed.

A disadvantage of conventional solutions that utilize "validation keys" is that while the probability of an unprogrammed device actually matching the key reduces dramatically with the number of bits, such a value is never zero. Thus, to help minimize such a risk, a validation key bit size can be increased. However, the larger the "validation key", the more area that is required for the circuit. Still further, when such a device is programmed, a "validation key" must be programmed as well, and there is potential yield loss associated with each additional NV element that is programmed.

A disadvantage of conventional solutions that utilize weighted memory cells is that such circuit structures can be unreliable, requiring low defect densities and near perfect matching of multiple parameters to ensure proper operation.

It would be desirable to have a solution for determining if a NV memory was programmed or not that can be more robust and/or occupy less area than conventional solutions.

In addition, it is desirable to support memory elements whose programmed status presents resistance values that vary considerably, such as those of anti-fuse structures.

DETAILED DESCRIPTION

Various embodiments of the present invention will now be described in detail with reference to a number of drawings. The embodiments show methods and devices that can determine whether or not a set of non-volatile (NV) elements has been programmed. The described approaches can sense the magnitude of a supply current that flows through a set of non-volatile (NV) elements and make a programmed or unprogrammed determination based on such a sensed current. The embodiments can be applied to NV elements that can have different supply current magnitudes when programmed as compared to when unprogrammed.

Figure 1:
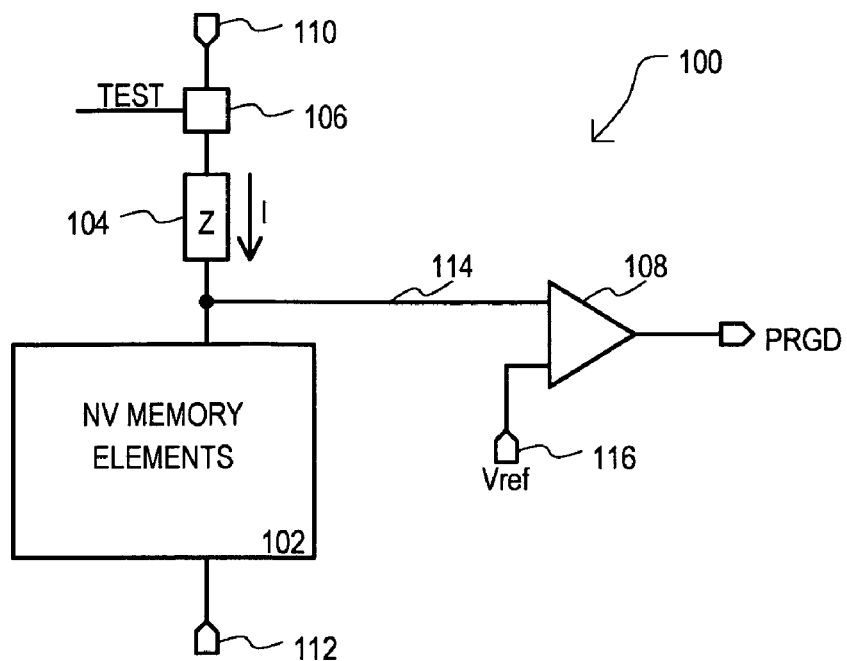
FIG. 1 is a block schematic diagram of a first embodiment of the present invention.

Referring now to FIG. 1, a test circuit according to a first embodiment is shown in a block schematic diagram and designated by the general reference character 100. A test circuit 100 can include number of memory elements 102 arranged into one or more groups, a test impedance 104, a test supply control switch 106, and a comparator circuit 108. Memory elements 102 can each include one or more NV structures that can establish a logic state of the element. The magnitude of a current drawn by a memory element can vary according to whether a memory cell is programmed or unprogrammed. Thus, if a group of memory elements 102 is unprogrammed, it will draw a current having a magnitude in one expected range. However, if a group of memory elements 102 is programmed, it will draw a current having a magnitude in another expected range. Test circuit 100 can measure a current (I) drawn by a group of memory cells to determine whether such memory cells are programmed or not.

Memory elements 102 can be arranged into multiple arrays or other logical and/or physical divisions to enable separate groups of memory elements. When enabled, a current path can be created that includes the NV structures of the group of memory elements. As but one example, memory elements can be arranged into words, or the other bit divisions. When accessed, NV structures within a selected word can be made part of a current path.

The example of FIG. 1 shows a "direct" measuring arrangement. As a result, a test impedance 104 can be situated between a first power supply node 110 and memory elements 102. When test supply control switch 106 is enabled (i.e., provides a low impedance path), memory elements 102 can draw a current I that flows through test impedance 104. As a result, a voltage generated across test impedance 104 can reflect the current drawn by accessed memory elements 102, and thus reflect a programmed state (e.g., programmed or unprogrammed) of the memory elements 102.

In the arrangement of FIG. 1, a current can flow between a first power supply node 110 and a second power supply node 112 through memory elements 102.

A comparator circuit 108 can be a voltage comparator having a first input connected to a sense node 114 situated between test impedance 104 and memory elements 102, and a second input connected to a reference voltage input 116. An output of comparator circuit 108 can be a program state signal PRGD. Thus, based on a comparison between a voltage generated by test impedance 104 and a voltage provided at reference voltage input 116, comparator circuit 108 can drive signal PRGD either high or low.

In this way, a test circuit can determine if NV structures within a group of NV memory are programmed or not by measuring a current drawn by such memory elements.

Figure 2:
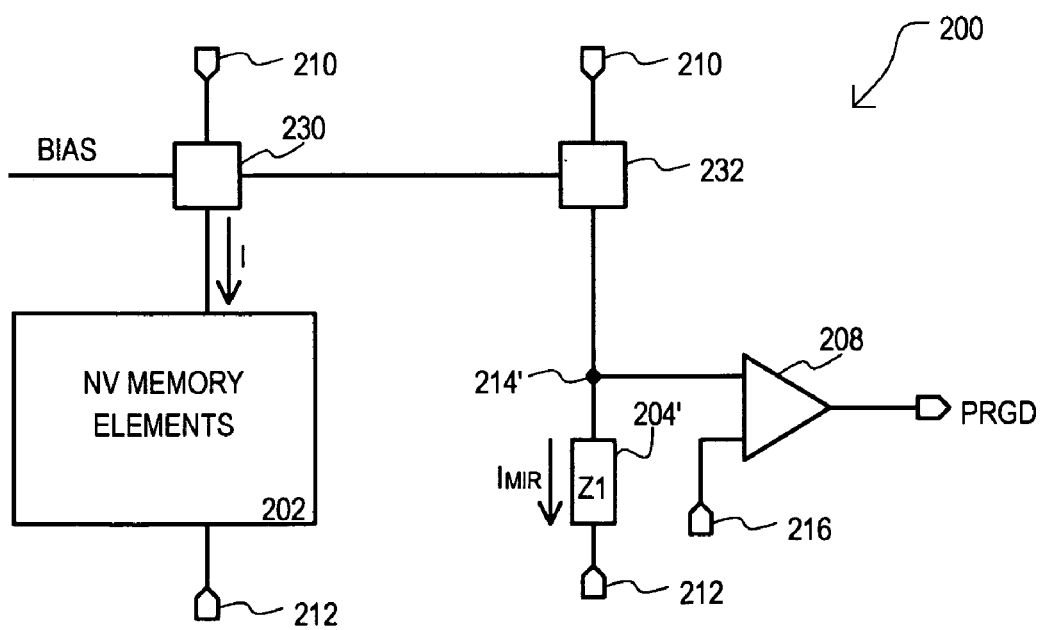
FIG. 2 is a block schematic diagram of a second embodiment of the present invention.

While a current drawn by memory elements can be measured directly, such a current can be measured indirectly. One example of such an approach is shown in FIG. 2.

A test circuit according to a second embodiment is shown in a block schematic diagram and designated by the general reference character 200. Test circuit 200 can include some of the same general sections as FIG. 1. Thus, like sections are referred to by the same reference character, but with the first digit being a "2" instead of a "1".

As noted above, the example of FIG. 2 shows an "indirect" measuring arrangement. In the example shown in FIG. 2, current I can be provided to memory elements 202 by a current supply circuit 230. Such a current can be mirrored (replicated in a proportional fashion) by a mirroring circuit 232 to generate a mirror current $I_{MIR}$. A test impedance 204' can be connected to mirroring circuit 232 and receive mirror current $I_{MIR}$. Thus, when a current I is drawn by memory elements 202, mirror current $I_{MIR}$ can flow through test impedance 204'. As a result, a voltage generated across test impedance 204' can reflect the current drawn by memory elements 202, and thus indicate a programmed state (e.g., programmed or unprogrammed) of the memory elements 202.

A comparator circuit 208 can be a voltage comparator having a first input connected to a sense node 214' situated between test impedance 204' and mirroring circuit 232. A second input of comparator circuit 208 can be connected to a reference voltage input 216. Thus, based on a comparison between a voltage generated by test impedance 204' and a voltage provided at reference voltage input 216, comparator circuit 208 can drive signal PRDG either high or low.

In this way, a test circuit can determine if NV structures within a group of NV memory are programmed or not by measuring a current that mirrors that drawn by such memory elements.

Figure 3:
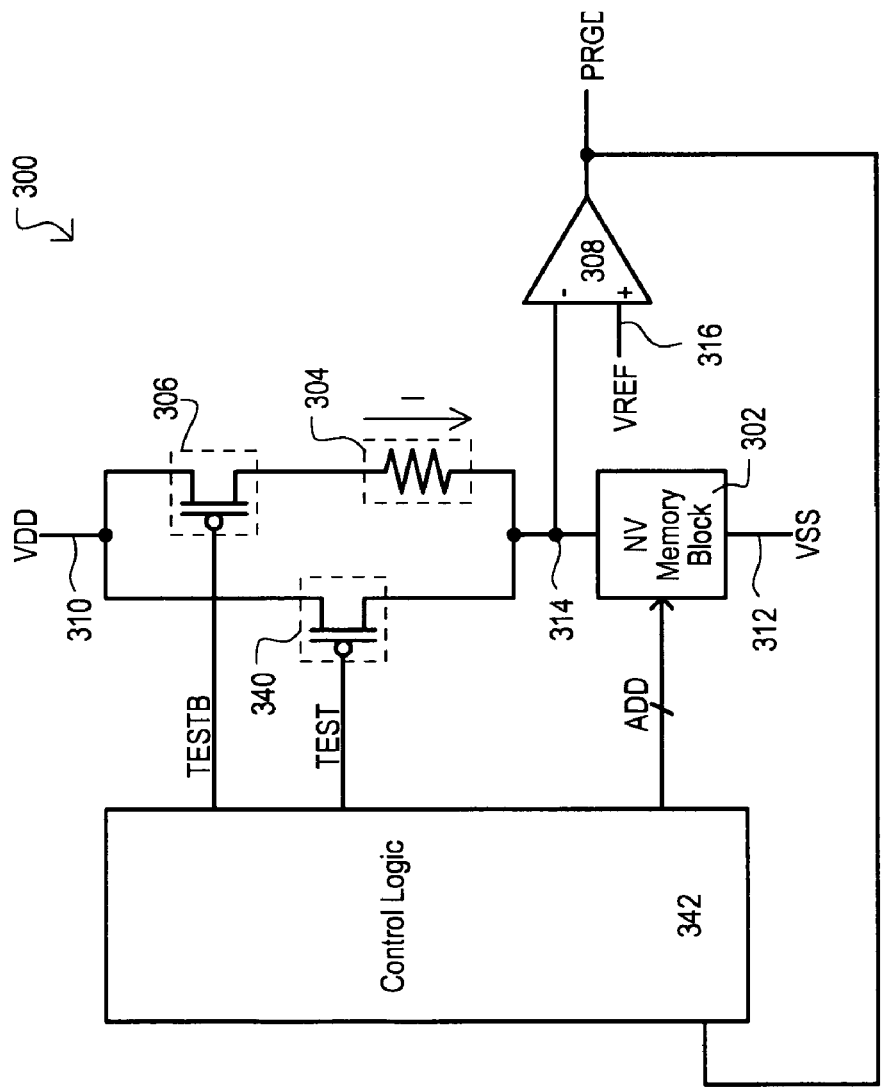
FIG. 3 is a block schematic diagram of a third embodiment of the present invention.

Referring now to FIG. 3, a test circuit according to a third embodiment is shown in a block schematic diagram, and designated by the general reference character 300. Test circuit 300 can include some of the same general sections as FIG. 1. Thus, like sections are referred to by the same reference character, but with the first digit being a "3" instead of a "1".

In FIG. 3, it is assumed that memory elements 302 will draw more current when programmed than when unprogrammed. Thus, a larger magnitude current I can indicate a programmed group of memory elements.

In the particular example of FIG. 3, a test impedance 304 can be a resistor, while a test supply switch 306 can include a p-channel insulated gate field effect transistor (PFET) having a source-drain path connected between a high power supply node 310 and test impedance 304, and a gate connected to receive a test signal TESTB.

Comparator 308 can be a differential amplifier having an inverting input (−) connected to sense node 314, a non-inverting input (+) connected to a reference voltage input 316, and an output that provides signal PRGD.

The embodiment of FIG. 3 also includes a supply switch 340 and control logic 342. A supply switch 340 can provide a supply current path to memory elements 302 in a non-test mode. In the particular example shown, a supply switch 340 can include a PFET having a source-drain path, connected between a high power supply node 310 and memory elements 302, and a gate connected to receive a test signal TEST.

Control logic 342 can generate signals TESTB and TEST, for controlling test supply switch 306 and supply switch 340. Even more particularly, in a test mode, signal TEST can be driven high, while signal TESTB can be driven low. Control logic 342 can also receive status signal PRGD and generate an address value ADD for selecting different groups within memory elements 302. In one particular embodiment, control logic 342 can generate an initial address to access a first group of memory elements 302, and then increment such an address to sequentially access different groups of memory elements.

Having described the structure of the third embodiment, the operation of test circuit 300 in a test mode will now be described.

In a test mode, control logic 342 can issue a first address value to access a first group of memory elements (i.e., place non-volatile structures in the path of current I). In addition, signal TEST can be driven high, while signal TESTB is driven low. Thus, PFET 306 can provide a current path to an accessed group of memory elements.

If the group of accessed memory elements is not programmed, a current drawn through test impedance 304 is sufficiently small that a potential at inverting input (−) remains higher than a reference voltage provided at non-inverting input (+). As a result, status signal PRGD will be low. However, if the group of accessed memory elements is programmed, a current drawn through test impedance 304 will be sufficiently large that a potential at inverting input (−) will fall lower than a reference voltage provided at non-inverting input (+). As a result, status signal PRGD can be driven high.

Once the program state of a group of memory elements at an initial address has been determined, control logic 342 can increment an address to access a next group of memory elements. This group may also be tested to determine if they are programmed or not. Such an operation can repeated until a status of all memory element groups has been determined.

While a test circuit can detect a voltage drop generated by a current input to a group of memory elements, other embodiments can detect a voltage rise generated by a current output from such memory elements. An example of such an approach is shown in a fourth embodiment in FIG. 4. Test circuit 400 of FIG. 4 can include some of the same general sections as FIG. 3. Thus, like sections are referred to by the same reference character, but with the first digit being a "4" instead of a "3".

Figure 4:
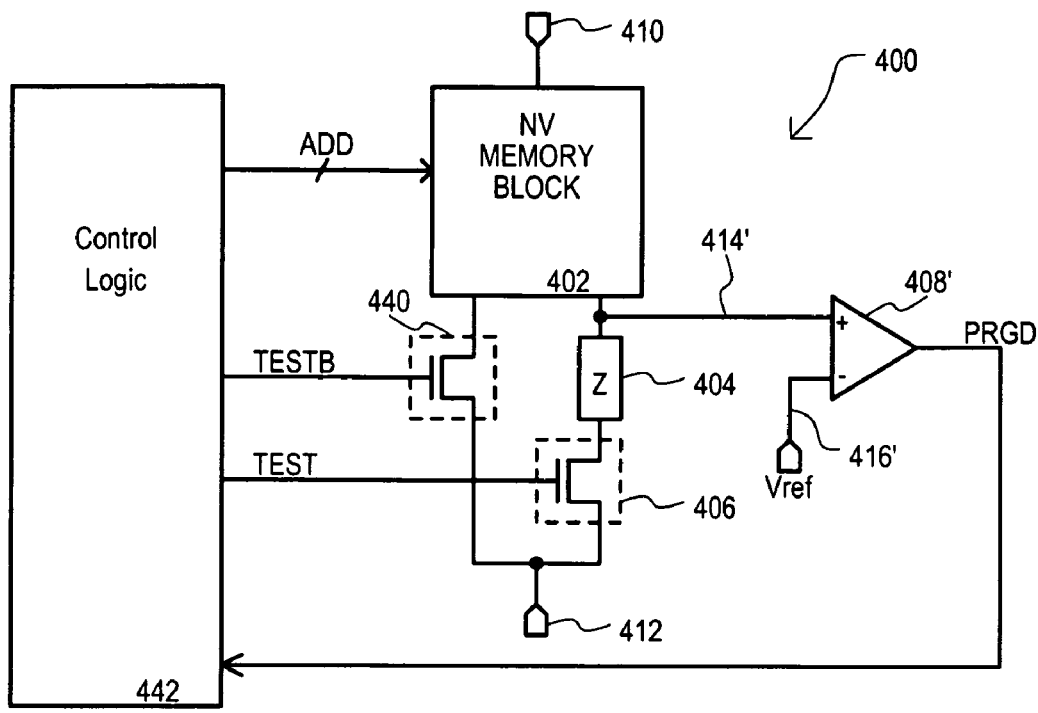
FIG. 4 is a block schematic diagram of a fourth embodiment of the present invention.

In the arrangement of FIG. 4, it is also assumed that memory elements 402 will draw more current when programmed than when unprogrammed. Thus, a larger magnitude current I can indicate a programmed group of memory elements. In addition, a test supply switch 406 can include an n-channel insulated gate field effect transistor (NFET) having a source-drain path connected between a low power supply node 412 and test impedance 404, and a gate connected to receive a test signal TEST. A supply switch 440 can also include an NFET having a source-drain path connected between a low power supply node 412 and memory elements 402.

Comparator 408' can have a non-inverting input (+) connected to sense node 414', an inverting input (−) connected to a reference voltage input 416', and an output that provides signal PRGD.

In a test mode, control logic 442 can issue a first address value to access a first group of memory elements (i.e., place non-volatile structures in the current path). In addition, signal TEST can be driven high, while signal TESTB is driven low.

Thus, NFET 406 can provide an output current path to an accessed group of memory elements.

If the group of accessed memory elements is not programmed, a current drawn through test impedance 404 is sufficiently small that reference voltage at inverting input (−) remains higher than a voltage at non-inverting input (+). As a result, status signal PRGD will be low. However, if the group of accessed memory elements is programmed, a current drawn through test impedance 404 will be sufficiently large that a potential at non-inverting input (+) will rise higher than a reference voltage provided at inverting input (−). As a result, status signal PRGD can be driven high.

Figure 5:
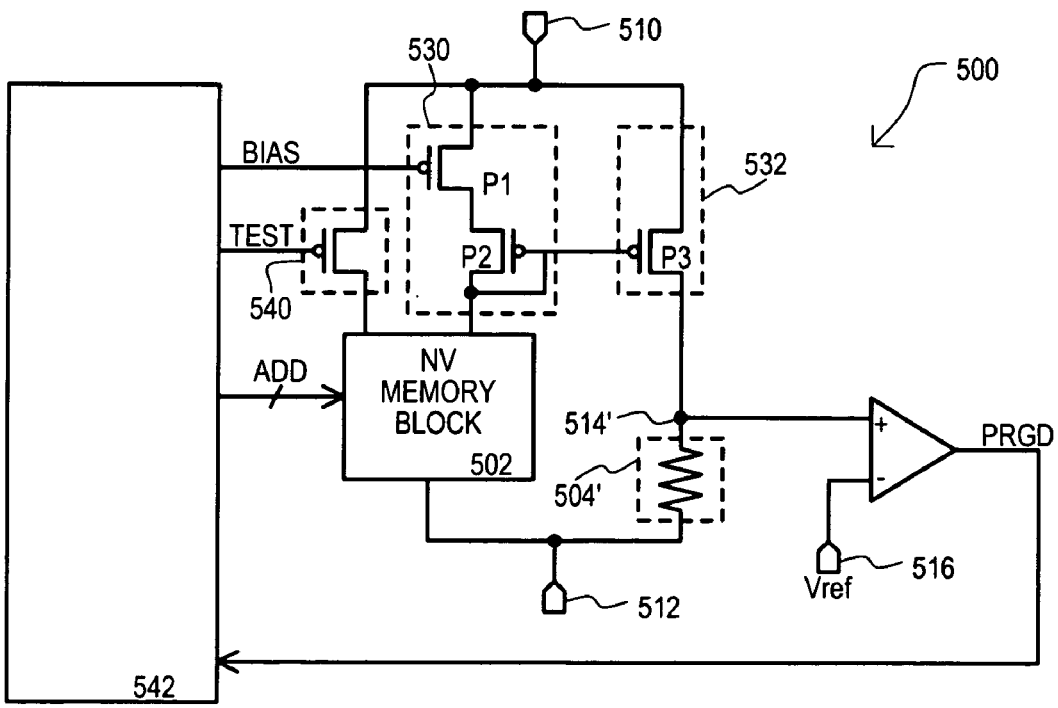
FIG. 5 is a block schematic diagram of a fifth embodiment of the present invention.

Referring now to FIG. 5, a test circuit according to a fifth embodiment is shown in a block schematic diagram, and designated by the general reference character 500. Test circuit 500 can include some of the same general sections as FIG. 2. Thus, like sections are referred to by the same reference character, but with the first digit being a "5" instead of a "2".

Again, the example of FIG. 5 assumes that memory elements 502 will draw more current when programmed than when unprogrammed. Thus, a larger magnitude current I can indicate a programmed group of memory elements.

In the particular example of FIG. 5, a test impedance 504' can be a resistor. A current supply circuit 530 and mirroring circuit 532 can include PFETs. More particularly, current supply circuit 530 can include a PFET P1 and PFET P2 having source-drain paths arranged in series between a high power supply node 510 and memory elements 502. PFET P1 can receive a signal BIAS at is gate. PFET P2 can have a common drain-gate connection to memory elements 502. Mirroring circuit 532 can include a PFET P3 having a source-drain path arranged in series between a high power supply node 510 and test impedance 504'. PFET P3 can have a gate connected to the gate-drain connection of PFET P2, and in this way mirror current provided by PFET P2. PFET P3 can be scaled with respect to PFET P2, but otherwise have matching transistor characteristics.

The embodiment of FIG. 5 also includes a supply switch 540 and control logic 542. A supply switch 540 can provide a supply current path to memory elements 502 in a non-test mode. In the particular example shown, a supply switch 540 can include a PFET having a source-drain path connected between a high power supply node 510 and memory elements 502 and a gate connected to receive a test signal TEST.

Control logic 542 can generate signals BIAS and TEST, for controlling test supply switch 506 and supply switch 540. Even more particularly, in a test mode signal TEST can be driven high, while a BIAS signal can bias transistor P1 with a bias voltage. Control logic 542 can also receive status signal PRGD from comparator 508 and generate an address value ADD for selecting different groups within memory elements 502. In one particular embodiment, control logic 542 can generate an initial address to access a first group of memory elements 502, and then increment such an address to sequentially access different groups of memory elements.

Having described the structure of the third embodiment, the operation of test circuit 500 in a test mode will now be described.

In a test mode, control logic 542 can issue a first address value to access a first group of memory elements (i.e., place non-volatile structures in the current path). In addition, signal TEST can be driven high, while signal BIAS can be driven to a bias voltage. Thus, PFET P2 can provide a current path to an accessed group of memory elements based on a magnitude of the resistance presented by the group of memory cells. Such a current can be mirrored by PFET P3 to provide a current to test impedance 504'.

If the group of accessed memory elements is not programmed, a current drawn through test impedance 504' is sufficiently small that a potential at inverting input (−) remains higher than a reference voltage provided at non-inverting input (+). As a result, status signal PRGD will be low. However, if the group of accessed memory elements is programmed, a current drawn through test impedance 504' will be sufficiently large that a potential at non-inverting input (+) will rise higher than a reference voltage provided at inverting input (−). As a result, status signal PRGD can be driven high.

Once the program state of a group of memory elements at an initial address has been determined, control logic 542 can increment an address to access a next group of memory elements. This group may also be tested to determine if they are programmed or not. Such an operation can repeat until a status of all memory element groups has been determined.

Of course, while FIG. 5 shows a mirroring with PFETs, other embodiments can mirror currents with NFETs.

Figure 6:
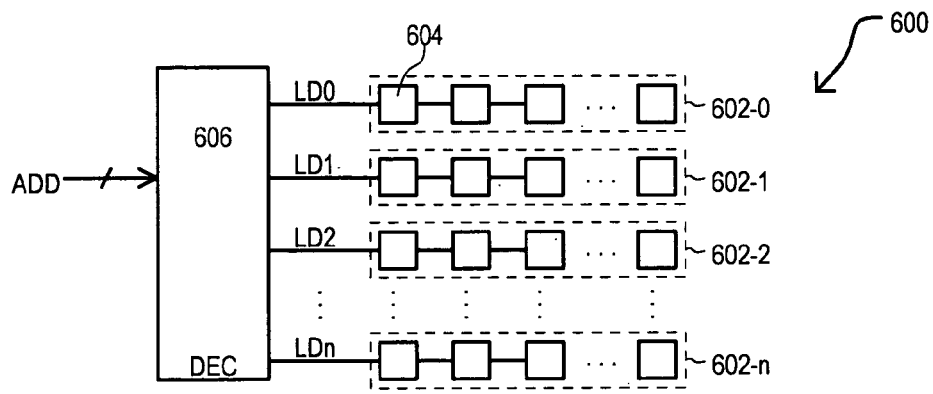
FIG. 6 is a block schematic diagram memory element groups that can be tested according to the embodiments.

Referring now to FIG. 6, one example of a memory element groups is shown in a block schematic diagram and designated by the general reference character 600. Memory elements 600 can include a number of memory cell groups 602-0 to 602-n, each accessible by a corresponding signal LD0 to LDn. One memory element is identified by character 604, for illustrative purposes. It is understood that when a group is accessed by a signal (LD0 to LDn), its NV structures are placed into a current path. Signals LD0 to LDn can be generated by an address decoder 606 that receives an address value ADD.

While FIG. 6 shows an arrangement of one row of memory elements forming an accessed group, other embodiments can access multiple rows and/or arrays. Thus, the illustrated row-by-row access should by no means be considered limiting to the invention.

While memory elements can take various forms, preferably memory elements include one or more anti-fuse devices, and even more preferably, two or more anti-fuse devices arranged to form a differential type latching arrangement.

Figure 7A:
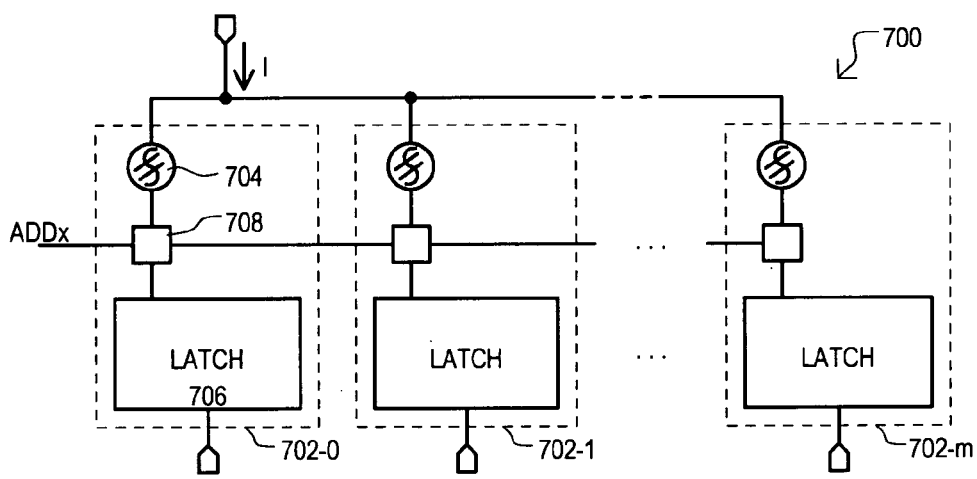
FIG. 7A is a block schematic diagram of a group of memory elements that can be tested according to the embodiments.

Examples of two of the many possible memory element groups that can be status tested according to the embodiments will now be described with reference to FIGS. 7A and 7B. FIG. 7A shows an example of a group of memory elements 700, each of which can include a single-ended one time programmable (OTP) latch 702-0 to 702-m. Each such single-ended OTP latch (702-0 to 702-m) can include a non-volatile (NV) section (one of which is shown as 704), a volatile section (one of which is shown as 706), and a transfer section (one of which is shown as 708). In the example shown, an NV section 704 can include an anti-fuse element. When in an unprogrammed state, such an element can draw little or no current. However, when programmed, such an element can have a substantially lower resistance, and hence draw a substantially larger amount of current. When transfer section 708 is enabled, according to the programmed state of NV section 704, a latch 706 can be forced to store one state or another according to the state of NV section 704.

Figure 7B:
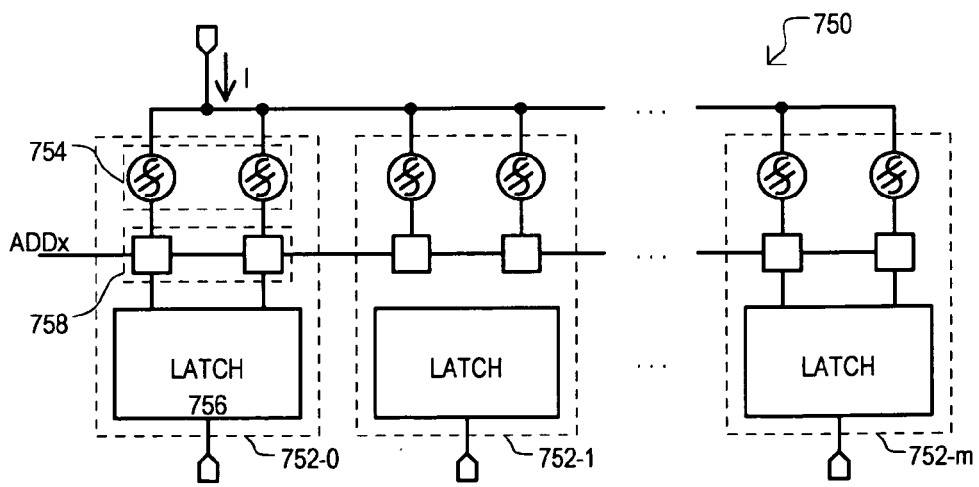
FIG. 7B is a block schematic diagram of another group of memory element that can be tested according to the embodiments.

FIG. 7B shows another example of a group of memory elements 750, each of which can include a differential type OTP latch 752-0 to 752-m. Each such differential type OTP latch (702-0 to 702-m) can include a non-volatile (NV) section (one of which is shown as 754), a volatile section (one of which is shown as 756), and a transfer section (one of which is shown as 758). It the example shown, an NV section 754 includes two anti-fuse elements arranged in parallel with one another. When a memory element (752-0 to 752-m) is unprogrammed, both anti-fuse elements can be unprogrammed. Conventionally, this can be a difficult state to detect when relying on latched values. In the programmed state, anti-fuse elements are programmed oppositely (one programmed the other unprogrammed). When transfer section 758 is enabled, according to the programmed state of NV section 754, opposing nodes in a latch 756 can be forced to opposite states, thus storing one state or another.

Of course, the examples of FIGS. 7A and 7B are but two of the many types of memory elements that can be tested according to the embodiments.

As shown in the various embodiments, a determination as to whether a group of memory elements is programmed or not can be based on a voltage comparison. In some cases, some anti-fuse technologies in particular, a resulting resistance of programmed NV elements may vary considerably. To accommodate such variation it may be desirable to provide variation in a reference voltage utilized to determine when a group of cells is programmed or not. One such arrangement is shown in FIG. 7C, and designated by the general reference character 770.

Figures 7C, 7D:
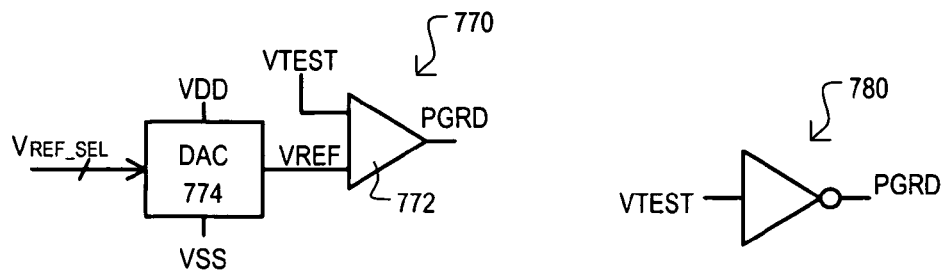
FIG. 7C is a block schematic diagram of a comparator arrangement that can be used in the embodiments.
FIG. 7D is a block schematic diagram of another comparator arrangement that can be used in the embodiments.

FIG. 7C shows a comparator circuit 770 having a comparator 772 with one input terminal connected to receive a test voltage $V_{TEST}$ and another input coupled to the output of a digital-to-analog converter (DAC) 774. A test voltage $V_{TEST}$ can be voltage that reflects the current drawn by a group of tested NV elements. DAC 774 can generate a reference voltage based on reference select data (VREF_SEL). Data VREF_SEL can be externally provided (i.e., externally to an integrated circuit containing the NV elements), or can be provided "on-chip" (by another section of the same integrated circuit). As but one example, such data can be established by laser opened fuses. Terminal connections for a test voltage and reference voltage would vary according to the application, as understood by those skilled in the art.

It is also noted that a voltage comparison need not be executed by an analog type comparison. A measured test voltage/current and reference voltage/current can be converted to digital values, via an analog-to-digital converter, and compared in a arithmetic fashion.

Still further, a comparator can be implemented as an inverter, with the threshold voltage of the inverter serving as the reference voltage. This is shown in FIG. 7D in which an inverter 780 can receive a test voltage $V_{TEST}$ reflecting the current drawn by a group of tested NV elements. If such a voltage exceeds the threshold voltage of the inverter, a status signal PGRD can be driven low. Of course the reverse case can be true, where, if test voltage $V_{TEST}$ falls below the inverter 780 threshold, signal PGRD can be driven high. A threshold can be adjusted by sizing devices within inverter, as is well understood by those skilled in the art.

While the embodiments can include various circuits and structures like those listed above, alternate embodiments can be directed to methods of testing NV element states.

Figure 8:
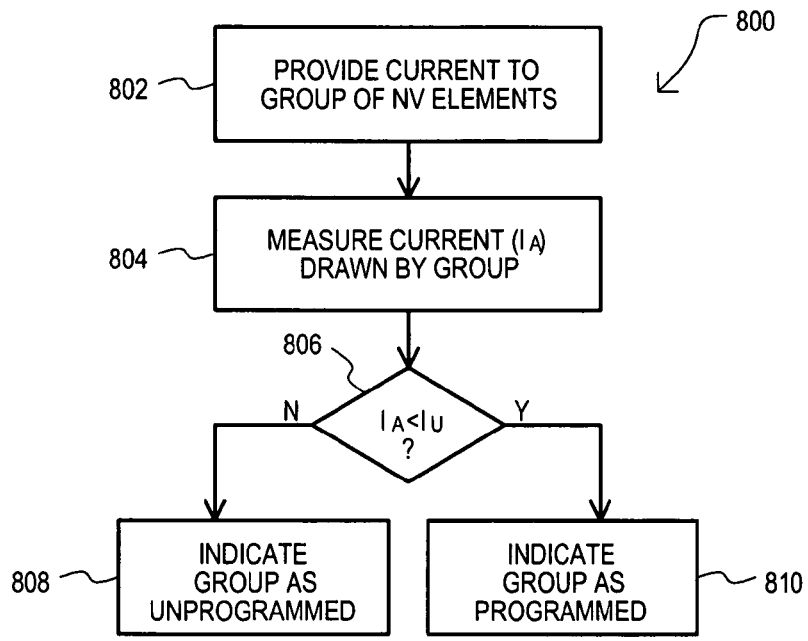
FIG. 8 is flow diagram of a method according to an embodiment.

A method according to one embodiment is shown in FIG. 8 and designated by the general reference character 800. A method 800 can include providing a current to a group of NV elements (step 802). A current drawn by the group ($I_A$) can be measured (step 804). Such a measurement can be done directly, or indirectly, as noted above. If a measured current ($I_A$) is determined to be less than predetermined reference current ($I_U$), the group of NV elements can be indicated as being unprogrammed (step 808). Conversely, if a measured current ($I_A$) is determined to be greater than a predetermined reference current ($I_U$), the group of NV elements can be indicated as being programmed (step 810). Of course, a comparison of FIG. 806 can include a greater-than-or-equal comparison.

Once a status (e.g., programmed or unprogrammed) for a group of NV elements has been determined, various steps can be taken. Two possible post determination methods are shown in FIGS. 9 and 10.

Figure 9:
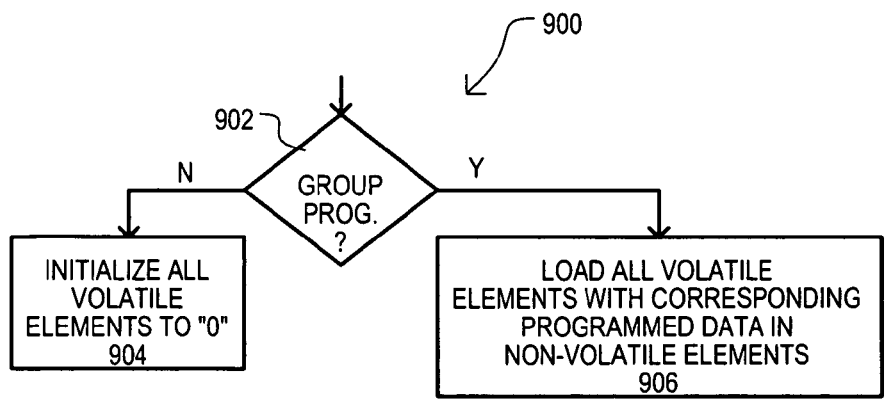
FIG. 9 is a flow diagram of another method according to an embodiment.

FIG. 9 is a flow diagram of a method 900 that includes determining if a group is programmed (step 902). Such a step can include any of the above described approaches or equivalents. If a group is not programmed, all volatile elements within the group can be initialized to a predetermined logic value (step 904). In the example shown, the value is a logic "0". If a group is determined to be programmed, all volatile elements within the group can be loaded with the data programmed in the corresponding NV elements (step 906).

Figure 10:
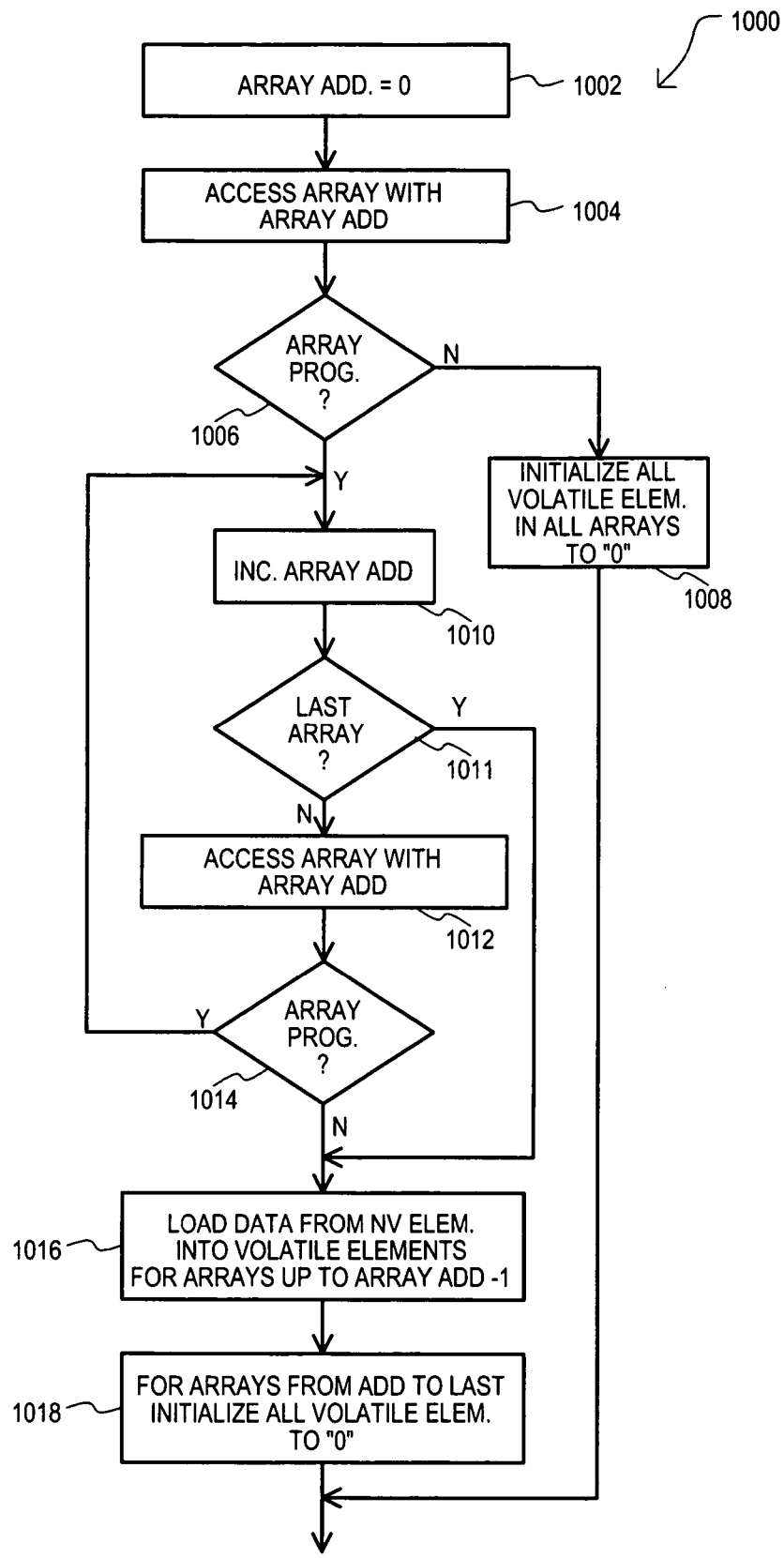
FIG. 10 is a flow diagram of a third method according to an embodiment.
Figure 11:
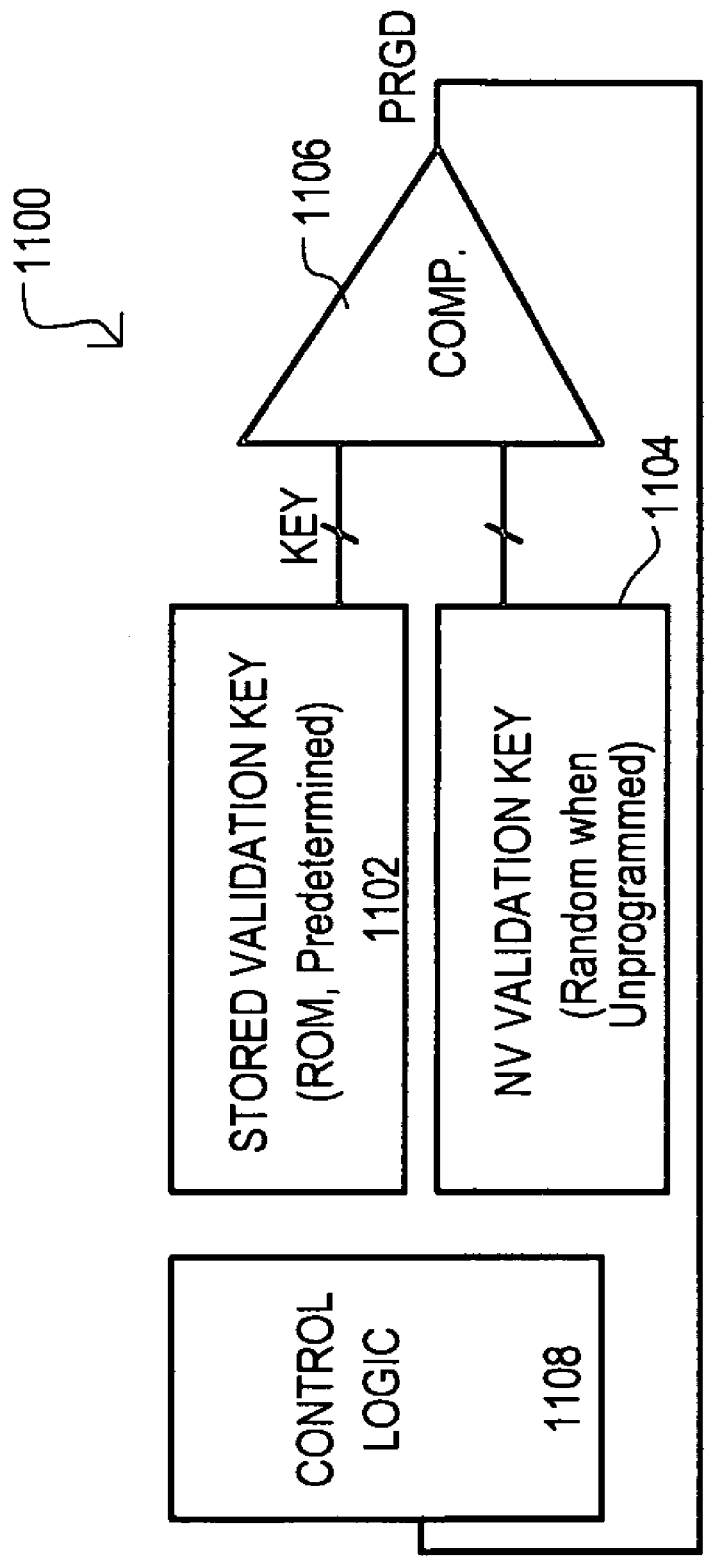
FIG. 11 shows a conventional NV element status testing circuit.

FIG. 10 shows a method that sequences through multiple groups of memory cells. Method 1000 of FIG. 10 is directed to testing multiple "arrays", but it is understood that the method need not be limited to any particular physical/logical arrangement of NV elements.

Method 1000 includes setting an array address to that of a first array to be tested. In the example of FIG. 10, this includes setting an array address to zero (step 1002). Such a first array can then be accessed according to the address (step 1004). Such a step can include enabling current paths that include NV elements in the array. The accessed array can then be tested to determined if it is programmed or not (step 1006).

If a first accessed array is determined to be not programmed, this can indicate no programming has taken place in all arrays. That is, method 1000 assumes that programming always starts with a first array. As a result, all volatile elements within all arrays can be set to a predetermined logic value. In the example shown, this value can be "0" (step 1008).

If a first accessed array is determined to be programmed, the array address can be incremented (step 1010). If a new address does not indicate that that last array has been tested (step 1011), a next array can then be accessed with the array address (step 1012), and the array tested to determine if it is programmed (step 1014). If the array is programmed, steps 1010, 1011 and 1014 can be repeated until an unprogrammed array is found, or a last array is reached.

If a last array is tested, or an unprogrammed array is found, data from the NV elements of the array can be loaded into volatile elements for all arrays up to address ADD-1 (which can be all arrays in the event a last array is reached) (step 1016). If any unprogrammed arrays exist, all volatile elements within such unprogrammed arrays can be set to a logic value. In the example shown, this value can be "0" (step 1018).

Of course, while various of the embodiments have incorporated anti-fuse technology, alternate embodiments can utilize fuse technology. In such alternate embodiments, if a "supply" current drawn by a group of such fuse based elements is lower than a predetermined threshold current IP (where IP is the maximum supply current of a set of programmed fuses), this can indicate that the array is "programmed". If the "supply" current is higher than a predetermined threshold IU this can indicate that the array is "unprogrammed".

Advantages of disclosed methods include that such circuits can allow the implementation of less costly anti-fuse or similar NV memory technology, to provide a cost advantage over conventional solutions utilizing different memory types. In addition, the improved method can maintain the robustness of a differential type NV memory element, without wasting area or risking yield loss on a validation key testing approach. For example, inclusion of a resistor and comparator (e.g., inverter in some embodiments) would be much smaller and more robust from a yield standpoint.

Embodiments of the present invention are well suited to performing various other steps or variations of the steps recited herein, and in a sequence other than that depicted and/or described herein.

For purposes of clarity, many of the details of the improved solution and the methods of designing and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A method for determining the state of non-volatile memory elements in an integrated circuit, comprising the steps of:
   a) enabling a current path to an array of non-volatile memory elements;
   b) determining a current drawn by the array;
   c) if the current drawn by the array is outside of a first predetermined limit, generating an indication that the array is programmed; and
   d) if the current drawn by the array is inside a second predetermined limit, generating an indication that the array is not programmed.

2. The method of claim 1, wherein:
   enabling the current path includes providing a low impedance path between a high power supply voltage node and the array.

3. The method of claim 1, wherein:
   enabling the current path includes providing a low impedance path between a low power supply voltage node and the array.

4. The method of claim 1, wherein:
   determining the current drawn by the array includes generating a test voltage with a resistance that receives the current drawn by the array and comparing the test voltage to a reference voltage.

5. The method of claim 1, wherein:

generating the indication that the array is programmed includes driving an indication signal to a first predetermined value, and outputting the indication signal from the integrated circuit; and generating the indication that the array is not programmed includes driving the indication signal to a second predetermined value, and outputting the indication signal from the integrated circuit.

6. The method of claim 1, further including:

each non-volatile memory element includes a non-volatile storage element and a volatile storage element;

if the indication is generated that the array is not programmed, initializing the volatile storage elements of the non-volatile memory elements of the array to the same logic value; and if the indication is generated that the array is programmed, loading logic states of the non-volatile storage elements of each memory element into the corresponding volatile storage element of the memory element.

7. The method of claim 1, further including:

each non-volatile memory element includes a non-volatile storage element and a volatile storage element and the method further includes e) setting an array address to a first address;

f) accessing a first array of non-volatile memory elements according to the array address;

g) performing steps a) to d) on the first array;

h) if the indication is generated that the array is programmed, increment the array address and repeat steps f) and g) until an unprogrammed array is found or the array address reaches a last address plus the increment value, initializing the volatile storage elements with the corresponding non-volatile element data for all arrays indicated by the last address minus the increment value.

8. The method of claim 1, wherein:

each non-volatile memory element includes a non-volatile storage element and a volatile storage element; and a) enabling the current path to an array of non-volatile memory elements includes providing a low impedance path between each non-volatile storage element of the array and the corresponding volatile storage element.

9. The method of claim 1, wherein:

the first predetermined limit is the same as the second predetermined limit.

10. A circuit for determining the state of a block of non-volatile (NV) memory elements, comprising:

at least one block of NV memory elements having a first power supply node that provides power to at least each NV memory element of the block;

a sense impedance that receives a current corresponding to a power supply current drawn by the block of NV memory elements; and a comparator having at least one input coupled to the sense impedance, the comparator generating a programmed indication when the current drawn by the block of NV memory elements exceeds a predetermined limit.

11. The circuit of claim 10, wherein:

each NV memory element comprises a non-volatile storage element coupled to a volatile storage element.

12. The circuit of claim 11, wherein:

the non-volatile storage element comprises at least one anti-fuse device and the volatile storage element comprises a latch.

13. The circuit of claim 12, wherein:

the non-volatile storage element comprises at least two anti-fuse device coupled in parallel to the power supply node.

14. The circuit of claim 10, further including:

a test controllable impedance path coupled between the first power supply node and the block of NV memory elements;

a supply controllable impedance path coupled between the first power supply node and the block of NV memory elements in parallel with the test controllable impedance path;

the sense impedance is coupled between the test controllable impedance path and the block of NV memory elements; and the comparator has a first input coupled to a node between the sense impedance and the block of NV memory elements and a second input coupled to receive at least one reference voltage.

15. The circuit of claim 14, wherein:

the first power supply node is a high power supply node and the test controllable impedance path and supply controllable impedance path comprise p-channel insulated gate field effect transistors.

16. The circuit of claim 14, wherein:

the first power supply node is a low power supply node and the test controllable impedance path and supply controllable impedance path comprise n-channel insulated gate field effect transistors.

17. The test circuit of claim 14, further including:

a control logic circuit that provides control signals to the test controllable impedance path, the supply controllable impedance path, and the block of NV memory elements, and is coupled to receive an output of the comparator.

18. The test circuit of claim 10, further including:

a test supply transistor having a controllable impedance path coupled between the first power supply node and the block of NV memory elements;

a test mirror transistor having a controllable impedance path coupled in parallel with the controllable impedance path of the supply transistor, and a control terminal coupled to the control terminal of the supply transistor to mirror the current provided by the test supply transistor; and the sense impedance is coupled to the controllable impedance path of the test mirror transistor.

19. An integrated circuit having non-volatile memory elements with testable states, comprising:

a plurality of memory element blocks, each block comprising a plurality of nonvolatile storage elements electrically connectable to corresponding latch circuits according to a load signal, each nonvolatile storage element comprising a volatile latch and a first anti-fuse device coupled to a first node of the volatile latch and a second anti-fuse device coupled to the second node of the volatile latch;

a supply control device that enables a current path to the memory element blocks; and a current measuring circuit that measures current drawn by a memory element block in response to the activation of the load signal of the memory element block and activates a programmed block status indication that indicates a memory element block is programmed when the current drawn by the memory element block is outside of a predetermined limit.

20. The integrated circuit of claim 19, wherein:
the current measuring circuit, comprises
   a test resistance coupled between the supply control device and the plurality of memory element blocks, and
   a comparator circuit having a first input coupled to the test resistance and a second input coupled to receive at least one reference voltage.

* * * * *